United States Patent [19]
Diamant et al.

[11] Patent Number: 5,851,311
[45] Date of Patent: Dec. 22, 1998

[54] POLYMERIZABLE FLUX COMPOSITION FOR ENCAPSULATING THE SOLDER IN SITU

[75] Inventors: Joram Diamant, Moraga; Henry L. Myers, San Jose, both of Calif.

[73] Assignee: Sophia Systems Co., Ltd., Tokyo, Japan

[21] Appl. No.: 625,062

[22] Filed: Mar. 29, 1996

[51] Int. Cl.$^6$ .................................................. B23K 35/00
[52] U.S. Cl. ................................. 148/23; 148/23; 148/24; 148/25
[58] Field of Search .................................. 148/23, 24, 25; 29/840, 841; 523/220; 428/355 EP, 418

[56] References Cited

U.S. PATENT DOCUMENTS

| | | | |
|---|---|---|---|
| 3,791,027 | 2/1974 | Angelo et al. | 29/495 |
| 3,923,571 | 12/1975 | Aoki et al. | 156/94 |
| 4,187,348 | 2/1980 | Dearlove et al. | 428/418 |
| 4,273,686 | 6/1981 | Noland et al. | 260/9 |
| 4,604,230 | 8/1986 | Goswami et al. | 252/514 |
| 5,064,481 | 11/1991 | Davis et al. | 148/23 |
| 5,116,433 | 5/1992 | Davis et al. | 148/24 |
| 5,167,729 | 12/1992 | Takemoto et al. | 148/23 |
| 5,211,763 | 5/1993 | Takemoto et al. | 148/23 |
| 5,243,133 | 9/1993 | Engle et al. | 174/52.4 |
| 5,249,101 | 9/1993 | Frey et al. | 361/717 |
| 5,260,130 | 11/1993 | Sakaguchi et al. | 428/355 |
| 5,261,155 | 11/1993 | Angulas et al. | 29/830 |
| 5,346,558 | 9/1994 | Mathias | 148/23 |
| 5,360,837 | 11/1994 | Honda et al. | 523/220 |
| 5,376,403 | 12/1994 | Capote et al. | 427/96 |
| 5,390,082 | 2/1995 | Chase et al. | 361/783 |
| 5,414,928 | 5/1995 | Bonitz et al. | 29/840 |

FOREIGN PATENT DOCUMENTS

| | | |
|---|---|---|
| 57-113505 | 7/1982 | Japan . |
| 1-204966 | 8/1989 | Japan . |

OTHER PUBLICATIONS

Shaun L. McCarthy, "New Test Methods for Evaluating Electrically Conductive Adhesives", SMI Proceedings, Aug. 1995, pp.562–567.

W. R. Ashcroft, "Curing Agents for Epoxy Resins", Chemistry and Technology of Epoxy Resins, 1993, pp.37–71.

Libor Matejka, Svatopluk Pokomy and Karel Dusek, "Network Formation Involving Epoxide and Carboxyl Groups", Polymer Bulletin 7, 1982, pp.123–128.

Anthony J. DeNicola, Jr. and James P. Bell, "Polyfunctional Chelating Agents for Improved Durability of Epoxy Adhesion To Steel", American Chemical Society Symposium Series 221, Epoxy Resin Chemistry 11, 1983, pp. 119–134.

Robert W. Lenz, "Organic Chemistry of Synthetic High Polymers", 1967, pp.536–551.

Report by Tsung–Yu Pan, Ph.D. of Ford Research Laboratory to NCMS members dated Dec. 1, 1995 regarding Metallographic Analysis of Solder Joints by Sophia Systems.

K. J. Kirsten, "Applications for One–Part Reflow/Encapsulant Formulation", International Conference on Electronic Assembly, Atlanta, Georgia, May 29–31, 1996.

*Primary Examiner*—Patrick Ryan
*Assistant Examiner*—M. Elve
*Attorney, Agent, or Firm*—Fenwick & West LLP

[57] ABSTRACT

A polymer-based solder paste composition having the strength and corrosion resistance of joints produced by conventional solder technology and the environmental and processing advantages of ICA technology comprises a powdered solder metal with a single component (single package) polymerizable flux composition. The polymerizable flux composition includes 55%–65% by weight of an epoxy such as epoxy novolac, the diglycidyl ethers of bisphenol A and F, and mixtures thereof, 0–15% by weight of a dicarboxylic acid, 9%–11% by weight of a polyalcohol, 3%–5% by weight of an amine thermal curing agent, and the balance including a chelating agent, a defoamer, a thixotrope and a surfactant. Upon heating, the solder metal spontaneously segregates from the flux composition, fuses, and forms a metallurgical joint, while the single-component polymerizable flux composition encapsulates the fused metal in a polymer coating which remains firm but pliable at reflow temperatures.

39 Claims, No Drawings

5,851,311

POLYMERIZABLE FLUX COMPOSITION FOR ENCAPSULATING THE SOLDER IN SITU

BACKGROUND OF THE INVENTION

1. Technical Field

This invention relates to the field of adhesive technology, and in particular, to the field of isotropic, electrically conductive adhesives.

2. Background Art

The standard method of joining and interconnecting electronic components is soldering with eutectic tin-lead (SnPb) solder in the presence of a fluxing agent. Conventional SnPb solder technology was invented over 5,000 years ago and is increasingly at odds with current manufacturing requirements. The problems with conventional solder technology originate in the high temperatures required, the reflow properties of solder, and the environmental impact of solder and solder fluxes.

Conventional SnPb solder requires temperatures of 200° C. or more for reflow. These temperatures can damage delicate circuit components, and the printed circuit boards (PCBs) on which components are mounted must be made of relatively expensive, heat resistant materials. The high reflow temperatures used can also cause "popcorning", where moisture is explosively released from heated solder and PCBs, creating cracks in standard solder joints. In addition, mounting devices on PCBs with conventional SnPb technology is complicated by the reflow properties of solder. In order to attach components to the bottom side of the PCB, components must be preliminarily attached to the PCB with a dot of adhesive, and the adhesive cured. The adhesive prevents components on the bottom side of a PCB from falling off when components on the top side of the board are soldered in place. Expensive machines called "dot shooters" deposit dots of adhesive, before the components are placed on the PCB.

The environmental problems created by conventional solder technology are attributable to both the toxicity of Pb and the composition and post soldering treatment of fluxes. Following reflow, conventional solder fluxes must be washed off circuit boards with cleaning fluids, and the cleaning fluids containing flux residues subsequently enter the environment. Previously, the cleaning fluids of choice were chlorofluorocarbons (CFC), which are ozone depleting compounds (ODC). ODCs are currently being phased out in favor of non-ODC cleaners and new, no-clean, low residue solders that do not require cleaning have been developed.

While these developments are positive, they do not eliminate the environmental problems associated with conventional solder technology. For example, ordinary fluxes contain 50 to 65% solvent. These solvents are volatile organic compounds (VOC) which evaporate during the soldering process and enter the atmosphere. No-clean solders use fluxes comprising 20% solids and 80% VOCs. Thus, while no-clean solvents reduce the need for cleaning solvents, they increase the level of pollution attributable to VOCs. In addition, no clean solders typically require inert atmospheres for reflow.

An emerging alternative to standard solder technology uses isotropic electrically conductive adhesives (ICAs) comprising conductive metal particles, often silver, dispersed in a polymerizable matrix. The two component composition of ICAs allows their electrical and mechanical properties to be tailored independently for a particular application. ICAs can be cured at temperatures as low as 130° C. This eliminates damage to heat sensitive components, allows the use of lower cost board substrates, and eliminates "popcorning", which does not occur at the lower processing temperatures of ICAs. In addition, the lower processing temperatures of ICAs eliminates the need for dot shooters and the associated manufacturing steps.

Currently available ICAs have found only limited use, because the adhesive-to-metal joint they form is substantially weaker and more susceptible to corrosion than the metallurgical bond created by soldering. ICA joints do not survive a mechanical shock test that is consistently passed by conventional solder joints. In this test, developed by the National Center for Manufacturing Sciences (NCMS) and aptly called the "drop test", a plastic leaded chip carrier (PLCC) having 44 J-shaped leads is mounted to pads on a PCB and dropped from a height of 5 feet six times. None of the currently available ICA joints survive the drop test.

With regard to corrosion, the adhesive-to-metal joints formed by ICAs are susceptible to degradation in elevated humidity/temperature conditions (85° C., 85% relative humidity). Under these conditions, oxygen diffuses into the ICA joints, causing oxidation and corrosion. The resulting ICA joints are unstable and their electrical and mechanical performance is unreliable. The electrical instability may be reduced through the use of oxide penetrating particles, but this does not improve the ICA joint's performance in the drop test.

SUMMARY OF THE INVENTION

This present invention is a polymer-based solder paste composition that combines the strength and corrosion resistance of joints produced by conventional solder technology with the environmental and processing advantages of ICA technology. In its unreacted state, the solder composition is a paste comprising a powdered metal and VOC-free, single component (single package) polymerizable flux composition. Upon heating, the metal powder spontaneously segregates from the flux composition, fuses, and forms a metallurgical joint. The single-component polymerizable flux composition encapsulates the fused metal in a polymer coating which remains firm but pliable at reflow temperatures. The polymer coating holds the soldered article in place while allowing rework of the soldered joint if necessary.

A solder composition in accordance with the present invention comprises a fusible, solderable metal alloy and a polymerizable, crosslinkable, thermosetting composition polymer formulation which acts as a fluxing agent and adheres to the molten metal while it is being cured. Applied heat melts the metal particles, which fuse as a result of the fluxing action. The resin then encapsulates the fused metal and cures as a solid polymer film on the surface of the fused metal. Unlike two part epoxies, the single component epoxy formulation does not require a chemical initiator to initiate polymerization, which is conveniently triggered by heat application. The single component formulation may also be vacuum processed, thus removing air, moisture, and vapors that may cause voids at reflow temperatures.

In the preferred embodiment of the invention, the polymer formulation includes polymerizable monomers, a dibasic organic acid, a polyalcohol (polyols), and a curing agent. In addition, the formulation preferably includes a chelating agent, defoamer, thixotrope and surfactant. The monomer is an epoxy or a mixture of epoxies, and the dibasic organic acid is a dicarboxylic acid, which reacts with the epoxy to enhance cross-linking and also acts as the primary fluxing agent. Two-function poly alcohols (diol) dissolve the acid, promote the acid's fluxing action, and chemically react with the epoxy. An amine curing agent promotes fluxing action, and in the preferred embodiment, also acts as surfactant and promotes wetting between the polymer and the molten solder. In selected cases, the dibasic acid component may be omitted from the formulation, in which case the fluxing action is provided by the amine and polyol components.

The chelating agent extends pot life and gel time of the composition by scavenging metal ions that are formed by the action of the acid and that promote copolymerization of the organic diacid and epoxy if allowed to accumulate. The chelating agent also promotes the adhesion of the polymer film to the molten metal surface during cure by chelating metal ions formed as a result of the fluxing process. The defoamer promotes the release of air and gas bubbles formed during melting of the metal, reducing the incidence of voids and "popcorning". When necessary, a surfactant is used to improve wetting of the molten metal surface and a thixotrope modifies the viscosity of the flux to make the composition more suitable for fine pitch printing by reducing sag and settling.

The properties of the metal powder employed in the solder composition can be chosen independently of the polymer formulation and fitted to the application. For example, an indium-tin eutectic alloy (52In48Sn, hereinafter InSn) melting at 118° C. may be used for low temperature applications (130° C. to 150° C.). For most other applications, the conventional tin-lead eutectic (63Sn37Pb, hereinafter SnPb) which melts at 183° C. is used. Choices of most other ingredients are dictated by the processing temperature and processing time required.

The solventless, VOC-less polymerizable flux of the present invention provides a metallurgical solder joint without the many deleterious environmental effects associated with fluxes, cleaning agents, and solvent evaporation in conventional soldering fluxes. In addition, problems related to solder joint failure caused by thermo-mechanical stresses and amplified by voids created by evaporating solvents are eliminated. Encapsulation of the solder joint by a polymer film makes it possible to use this material as a die attach adhesive, eliminating the need for dot shooters and the extra processing steps associated with their use. The solder composition provides a conductive joint that passes the drop test, and results in a stable junction under elevated temperature/humidity conditions, as required by most transportation, aerospace and military applications.

DESCRIPTION OF THE PREFERRED EMBODIMENTS

In order to appreciate the advantage of the present invention, an overview of the joint formation process is provided for the case of a SnPb alloy processed at a temperature of 200° C. for 3 minutes. Over the 3 minute heating period, the following processes occur:

a. Heat is transferred to the solder and the polymer formulation.

b. The solder particles melt.

c. The polymer formulation viscosity drops resulting in a low viscosity liquid.

d. Oxides on the surface of the solder particles are dissolved by the fluxing action and the particles sinter to form a continuous fused metal.

e. The polymer formulation is squeezed out to the surface of the fused solder.

f. The polymer formulation gels and cures in situ on the surface of the molten metal.

Typically step (a) takes about 30 seconds. Steps (b), (c) and (d), which are approximately concurrent, take place in the next 30 seconds. The fluxing action occurs primarily in this 30 second period, during which time the polymer formulation has to remain a low viscosity liquid in order to ensure that the metal sinters and fuses properly. Over the next 2 minutes, the polymer has to cure and create a continuous solid film covering the surface of the still molten metal.

A careful and precise balance of ingredients is necessary in order for the solder composition to perform all these processes in the allotted time intervals. The acid component of the polymeric formulation is the principal fluxing agent, but it is aided by the polyol component and the curing agent, when the latter is an amine. The gel time and cure are controlled primarily by the amine curing agent and the epoxy, but are also influenced by the dibasic acid and chelating agent used. The wetting and surface activity of the formulation prevent the polymeric material from dewetting (rolling off) the surface of the molten metal and forming into drops.

Steps similar to (a)–(f) occur in processes using InSn alloys for the metal component. In theses case, however, the lower melting point of the InSn eutectic allows the processes to be run at 150° C. Since there is no danger of heat damage to electronic components at this lower processing temperature, a 10 minute heating cycle may be used. The lower temperature and longer cycle time are more forgiving and allow a broader choice of components for the polymeric formulation.

For purposes of the present invention, the term solder metal refers to any of the standard solder metals and alloys. Examples of solder metals suitable for use in the present invention are those provided in *Indalloy Specialty Solders & Alloys* (1988), a product catalog published by the Indium Corporation of America.

The solder compositions in accordance with the present invention do not create residues that must be cleaned from the soldered joint. For example, two samples prepared with the solder composition of the present invention were placed in an extraction apparatus following a three minute cure. One sample was extracted with boiling water for 8 hours, and the other sample was extracted with boiling tetrahydrofuran (THF) for 8 hours. Despite the harsh conditions, less than 2% by weight of the polymerized material was extracted by the water, and typically only about 1.4% was extracted. This is less than the total residue produced by low residue and no-clean solders. The electrical resistance of the extract water was also measured to determine the level of extracted corrosive, ionic residue, in conformance with accepted military specifications (MIL-P-28809). Measured resistances were typically greater than 200 K$\Omega$, indicating that substantially no residue had been removed from the polymerized solder joint. In the preferred embodiments of the composition, measured resistances were >>1 M$\Omega$.

Extraction with THF provides an indication of the relative amounts of polymer in the sol and gel phases, with the gel phase being preferred. THF extraction indicates that approximately 50% to 70% of the polymer is in the insoluble gel phase following a three minute cure. Higher proportions of gel phase would be expected following longer cures.

Solder compositions in accordance with the present invention greatly reduce the amount of VOCs generated by soldering. For example, the polyols included as a solvent for the dicarboxylic acids and to promote fluxing, have boiling points of >200° C. They do not evaporate at typical reflow temperatures but rather react with the epoxy component, as discussed below. Consequently, VOCs evolved by the soldering composition either during or following soldering are minimized. The weight loss of the polymer formulation during cure at 200° C. is about 8% based on the polymer. In contrast, standard commercial fluxes lose approximately 50 to 80% of their total weight as volatile organic compounds that evaporate from the flux material.

Components soldered with the formulation of the present invention do not move in consecutive reflow cycles because they are held in place by the polymer coating generated on heating. Surface mounted components can be reflowed while upside down without falling off the board. The polymer coating, which is hard at room temperature, retains its binding strength to the PCB at the reflow temperature but is sufficiently pliable to make reworking the junction possible.

Available ICAs, while providing comparable bonding at elevated temperatures, do not produce the strong, stable, corrosion resistant joints provided by compositions in accordance with the present invention. Drop tests performed on PCBs including joints made with a polymerizable flux in accordance with the present invention failed to dislodge soldered components. The drop tests were repeated after placing the PCBs in a reflow oven with the components facing down, and no failures were produced at any time.

In the preferred embodiment of the present invention, the polymerizable formulation contains crosslinkable monomers such as epoxides. Among the epoxides, epoxy novolacs provide the highest degree of polymerization and crosslinking because of their high functionality. Functionality is defined as the number of epoxide units per molecule, which in the case of epoxy novolacs is between approximately 3 and 4.

The viscosity of the polymeric composition increases with increasing functionality of the epoxy, and the degree of crosslinking has to be balanced against the fluxing ability of the composition, which is favored by lower viscosity. For example, a balance may be obtained between high functionality and low viscosity by mixing an epoxy novolac with a lower viscosity, two-function epoxy or diepoxide. Among the diepoxides, the most useful are the diglycidyl ethers of bisphenol A and bisphenol F. The latter usually offer a similar performance to the diglycidyl ethers of bisphenol A but has a lower viscosity. For purposes of this discussion, low viscosities are those in the range of about 10–300 centipoise (cps), low/medium viscosities are in the range of about 300–2000 cps, medium viscosities are between about 2,000–5,000 cps, and high viscosities are anything greater than about 5,000 cps.

Illustrative of the epoxies used in the present invention are Dow Epoxy Novolac DEN 438 (DEN 438) mixed with Ciba-Geigy's Araldite PY 306 (PY 306), a Diglycidyl Ether of Bisphenol F (DGEBF). DEN 438 has a functionality of 3.6 and is a semi-solid at room temperature, with a viscosity of about 20,000 to 50,000 cps at 52° C., while PY 306 has a functionality of 2.0 and a viscosity of 1,500 cps at 25° C. In the preferred embodiment employing DEN 438 and PY306, a mixture of 2 parts by weight of DEN 438 and 1 part PY 306 is used to give an average functionality of 3.0.

Also suitable as an epoxy component for the present invention is Shell Chemical's Epon SU 2.5, which is 70% Epon 828, a Diglycidyl Ether of Bisphenol A (DGEBA), and 30% epoxy novolac. Epon 828 has an average functionality of 2.1 and a viscosity of 13,000 cps at 25° C. Another epoxy composition suitable for the polymeric resin formulation is Ciba-Geigy's Araldite CY 184, diglycidyl ester of hexahydropthalic(1,2-Cyclohexanedicarboxylic)anhydride with a viscosity of 900 cps at 25° C. The cross-linking provided by this epoxy is not as extensive as that provided by DEN 438/PY306 or EPON SU 2.5. However, CY 184 does have a relatively low viscosity and good adhesion to the molten solder, since it may chelate the metal ions in the process of polymerization. Cyracure UVR 6105, a 3,4-epoxycyclohexylmethyl-3,4-epoxycyclohexane produced by Union Carbide and having a viscosity of 230 cps, may be added to these epoxy formulations when needed to reduce viscosity. Similarly, Heloxy 68, a two functional epoxy, is a reactive diluent that may be added to the above epoxies to reduce the viscosity of the polymer composition.

Alternative embodiments of the present invention may employ UV curable epoxy-acrylate combinations. These are advantageous in cases where high crosslinking is desired and the junctions are accessible to UV radiation. Examples of epoxy acrylate combinations are Ebecryl 3800, a carboxy functional epoxy acrylate made by UCB Radcure Inc. Ebecryl 3800 is a slow reacting, high viscosity, high functionality liquid. It may be combined with 1,6-hexanediol diacrylate (HDODA), a fast reacting, low viscosity liquid (9 cps at 25° C.), or with epoxidized soy bean oil acrylate, a medium viscosity, moderately slow reacting liquid, to produce an epoxy suitable for use in the present invention.

The primary fluxing agents in the present invention are dibasic carboxylic acids, which are also known as dicarboxylic acids or dioic acids. Dicarboxylic acids are more likely to react with epoxy and produce more extensive crosslinking than monobasic acids. Since dibasic acids have higher functionality (carboxyls per molecule) than monobasic acids, less acid is needed in the formulation. Examples of dicarboxylic acids employed in compositions of the present invention are glutaric acid (pentane dioic acid), adipic acid (hexane dioic acid), azelaic acid (nonane dioic acid), and 1,3-cyclohexanedicarboxylic acid, all of which are solids. A high viscocity liquid such as poly(ethylene glycol)bis (carboxymethyl)ether (PEGBCME) with molecular weight of about 250, may also be used. All dibasic carboxylic acids used in the polymeric formulations described were obtained from Aldrich Chemical Co.

As noted above, the dibasic acid component of the flux may be omitted in selected formulations, in which case the amine curing agent and polyol components provide the flux promoting action. One such case provides high conductivity solder joints by including silver particles with the solder metal and allowing the relatively low melting temperature solder metal to establish electrical contact with the high melting point, highly electrically conductive silver particles when heat is applied. Because silver ions are particularly effective at initiating polymerization in the presence of acids, the dibasic acid component is omitted from the flux, and fluxing action is provided by the combined actions of the amine thermal cure agent and the polyol.

In addition to enhancing the fluxing action, polyfunctional alcohols serve as good, non-volatile (high boiling point) solvents for dicarboxylic acids, when this component is present. Polyols have the further advantage of crosslinking with the epoxy component, but they also have relatively high viscosities. Two functional alcohols (diols) provide a good compromise between cross-linking ability and low viscosity, but a number of lower viscosity triols may be used as well. For example, the diols, ethylene glycol and propane diol, and especially triethylene glycol, diethylene glycol, 1,3 propane diol and 1,2 propane diol, provide a reasonable compromise between cross-linking ability and low viscocity. Polyoxypropylene triols such as Arcol LHT 112 made by ARCO Chemical Co. and polyether triols such as Voranol 230–238 made by Dow Chemical Co. also provide a reasonable balance between cross-linking and low viscosity.

Amines are a very large group of chemically reactive compounds which can act as curing agents for epoxies. Primary and secondary amines directly crosslink with epoxy while tertiary amines act as catalysts to enhance cross-linking among epoxies and hydrogen donating molecules such as hydroxyls and carboxyls. In the preferred embodiment of the solder composition, the curing agent is selected from the family of amidoamines. Amidoamines are a product of monobasic carboxylic acids (fatty acids) and aliphatic polyamines. Consequently, they possess amine as well as amide functionalities, in addition to properties imparted by the particular fatty acid used. Witcamine 210, a pasty solid which is made by Witco Corp. and sold as a surfactant, was found to provide particularly good wetting and adhesion between the molten metal and the polymer flux. For 150° C. cure dicyandiamide (DICY) was used in the form of a fine white powder named Amicure CG-1400 and produced by Air Products and Chemical Co. Also used was Ancamide 506, a low viscosity liquid made currently by Air Products and Chemicals Co. To enhance good through-cure at 200° C., a boron trifluoride-amine complex, Anchor 1040, supplied by Air Products Chemicals, was used.

A number of different chelating agents were found to be useful in the present invention. These include ethylenediamine tetraaceticacid (EDTA) obtained from Aldrich, Irganox MD 1024, a 1,2-bis(3,5-di-tert-butyl-4-hydroxyhydrocinnamoyl)hydrazine made by Ciba-Geigy, and Naugard XL-1, a 2,2'-oxamido bis-[ethyl 3-(3,5-di-tert-butyl-4-hydroxyphenyl)propionate] made by Uniroyal Chemical Company. Of these, EDTA is the most commonly used chelating agent but has a very limited solubility. MD 1024 and Naugard XL-1 are both a combination of hindered phenol antioxidant and amide type chelating agents. MD 1024 showed the best compatibility with the present compositions.

For defoaming, Dislon OX-70 was used. This is a polymethacrylate defoamer and wetting agent made by Kusumoto Chemicals of Japan and sold in the U.S. by King Industries. In some cases a thixotropic agent, Dislon 6900-20X, was also used. This is a polyamide wax manufactured by Kusumoto Chemicals and sold by King Industries.

The surfactant used in the preferred embodiment of the invention is Silwet L-77, a mixture of polyalkyleneoxide modified heptamethyltrisiloxane and allyloxypolyethyleneglycol methyl ether, made by OSi Specialties, Inc.

In sum, the preferred embodiment of the polymer flux composition comprises the following components in the indicated percent weight ranges:

Epoxy: 55%–65%
Acid: 0%–15%
Diol: 9%–11%
Amine: 3%–5%
Chelate: 4%–6%
Defoamer: 0.5%–1%
Surfactant: 0.5%–1.5%
Thixotrope: 1%–5%

Examples of some of the compositions produced and tested are presented below.

EXAMPLE 1

In a container prepare a mixture comprising by % weight: 14% glutaric acid and 14% triethylene glycol. Heat at 130° C. and stir until the glutaric acid dissolves. Add 5% Irganox MD 1024 and reheat while stirring until the latter reaches its limit of solubility. Then remove from the heat, add 23% Araldite CY 184, mix and add 38% of a 2:1 mixture of DEN 438 and Araldite PY 306 and mix thoroughly. Add 1% Dislon OX-70 and 5% Witcamine 210. Mix thoroughly, transfer to a vacuum vessel and stir for 20 to 30 minutes at 4,000 RPM. The pressure should equilibrate at 70 mTorr. To the polymer formulation thus prepared add SnPb powder to bring the total composition to 88% SnPb and 12% polymer formulation. Stir under vacuum for 30 minutes at 500 to 1,000 RPM. The pressure should again equilibrate at 70 mTorr.

EXAMPLE 2

The polymer formulation of example 1 in which Witcamine 210 is replaced with 5% Ancamide 506. All other ingredients and mixing procedures are the same.

EXAMPLE 3

The polymer formulation of example 1 in which Irganox MD 1024 is replaced with 5% Naugard XL-1. AL other ingredients and procedures are the same.

EXAMPLE 4

The polymer formulation of example 1 in which Irganox MD 1024 is replaced with 5% EDTA. All other ingredients and procedures are the same.

EXAMPLE 5

The polymer formulation of example 1 in which triethylene glycol is replaced by 14% Arcol LHT-112. All other ingredients and procedures remain the same.

EXAMPLE 6

The polymer formulation of example 1 in which triethylene glycol is replaced by 14% Voranol 230–238.

EXAMPLE 7

The polymer formulation of example 1 in which glutaric acid is replaced with 1,3-cyclohexanededicarboxylic acid. All other ingredients and procedures remain the same.

EXAMPLE 8

The polymer formulation of example 1 in which glutaric acid is replaced with 18% adipic acid. Proportions of other ingredients are as follows: 14% triethylene glycol, 5% Irganox MD 1024, 23% Araldite CY 184, 34% mixture of DEN 438/Araldite PY 306, 5% Witcamine 210 and 1% Dislon OX-70. All procedures remain the same.

EXAMPLE 9

The polymer formulation of example 1 in which glutaric acid is replaced with 22% azelaic acid. Proportions of other ingredients are as follows: 13% triethylene glycol, 4% Irganox MD 1024, 22% Araldite CY 184, 33% mixture of DEN 438/Araldite PY 306, 5% Witcamine 210, 1% Dislon OX-70. All procedures are the same.

EXAMPLE 10

The polymer formulation of example 9 in which azelaic acid is replaced with 22% PEGBCME. All other ingredients and procedures remain the same.

EXAMPLE 11

The polymer formulation of example 1 in which the proportions of ingredients are changed as follows: 15% glutaric acid, 15% triethylene glycol, 15% Araldite CY 184, 40% DEN 438/Araldite PY 306 mixture. Add 4% Dislon 6900-20X. All other ingredients and procedures are the same.

EXAMPLE 12

In a vacuum container prepare a polymer formulation comprising by % weight: 15% glutaric acid, 10% triethylene glycol, 2% Irganox MD 1024, 10% Araldite CY 184, 28% Araldite PY 306, 25% Epon SU 2.5, 6% Witcamine 210, 0.5% Dislon OX-70 and 3.5% Dislon 6900-20X. All the procedures are the same as in example 1.

EXAMPLE 13

In a vacuum container prepare a polymer formulation comprising by weight: 15% glutaric acid, 15% triethylene glycol, 56% Ebecryl 3800, 10% HDODA, 4% benzophenone. Stir for 30 minutes at no more than 1,000 RPM and not lower than 200 mTorr pressure. Add SnPb powder in the amount to bring the total composition to 88% SnPb and 12% polymer formulation. Stir for 10 minutes at no more than 500 RPM and not lower than 200 mTorr pressure.

EXAMPLE 14

The polymer formulation of example 13 in which the amount of Ebecryl 3800 is reduced to 49%, HDODA is replaced by 10% epoxidized soy bean oil acrylate, and 5% Irganox MD 1024 is added. All other ingredients and procedures are the same as in example 13.

All the above compositions are designed for 200° C. cure for 3 minutes in a conventional forced air oven. Compositions of examples 13, and 14 are also UV curable. The following compositions are designed for 150° C. cure for 10 minutes.

EXAMPLE 15

In a vacuum container prepare a polymer formulation comprising by % weight: 15% glutaric acid, 10% 1,3-propane diol, 30% Cyracure UVR 6105, 30% Araldite PY 306, 5% Amicure CG 1400, 5% Dislon 6900-20X, 5% Silwet L-77. All procedures are the same as in example 1, except SnPb is replaced with InSn.

EXAMPLE 16

In a vacuum container prepare a polymer formulation comprising by weight: 20% adipic acid, 10% 1,3-propane diol, 35% Cyracure UVR 6105, 20% Araldite PY 306, 10% Amicure CG 1400, 5% Silwet L-77. All procedures are the same as in example 15.

EXAMPLE 17

In a vacuum container prepare a polymer formulation comprising by weight 15% 1,3-cyclohexane dicarboxylic acid, 10% triethylene glycol, 5% Inganox MD 1024, 32% Araldite CY 184, 32% Epoxy novolac DEN 438, 2% Witcamine 210, 3% Anchor 1040, and 1% Dislon OX-70. The resulting composition yields a resistance of the boiling water extract, performed in accordance with MIL-P-28809 of 5 M$\Omega$, and approximately 75% of the material is not extractable with boiling THF.

EXAMPLE 18

In a vacuum container prepare a polymer formulation comprising by weight 15% 1,3-cyclohexane dicarboxylic acid, 10% triethylene glycol, 5% Inganox MD 1024, 29% Araldite CY 184, 29% Epoxy novolac DEN 438, 6% Heloxy 68, 2% Witcamine 210, 3% Anchor 1040, and 1% Dislon OX-70. The resulting composition yields a MIL-P-28809 resistance of approximately 1.5 M$\Omega$ and approximately 50% of the material is not extractable in boiling THF.

EXAMPLE 19

In a vacuum container prepare a polymer formulation comprising by weight 12% triethylene glycol, 6% Inganox MD 1024, 38% Araldite CY184, 25% Cyracure UVR 6105, 10% Heloxy 68, 5% Anchor 1040, 3% Witcamine 210, and 1% Dislon OX70. The resulting composition yields an MP-P-28809 resistance of approximately 1.9 M$\Omega$.

Generally, glutaric acid and 1,3-cyclohexane dicarboxylic acid are interchangeable in each of the above-described examples that includes a dicarboxylic acid. However, the 1,3-cyclohexane dicarboxylic acid may provide better wetting between the polymer formulation and the molten metal.

The single package epoxies used in the present invention, i.e. epoxies that do not rely on chemical hardeners to trigger polymerization, allow ingredients to be vacuum processed, as indicated in each of the examples. As noted above, this removes trapped air, moisture, and vapors that can degrade the quality of the bonds formed.

Performance standards for die attach adhesives collected from various references indicate that the dominant concerns of ICA manufacturers/users are adhesion and stable contact resistance. The consensus from the surveyed references appears to be that the minimum die shear strength should exceed 1000 psi and preferably be over 2000 psi after each environmental test, mechanical shock, or vibration. The compositions of the present invention produce solder joints, which typically withstand forces up to 6,000 psi, well above the recommended values for conventional ICAs.

Standard solders, such as those employed in the composition of the present invention, have resistivities of about 13 $\mu\Omega$-cm. For ICAs, MIL-STD883c.M5011.2 recommends a maximum acceptable value of 300 $\mu\Omega$-cm. Thus, the present invention produces joints well withing the MIL spec. A major concern with ICAs is the stability of the junction resistance following environmental tests. An increase in resistance of no more than 20% after each environmental or mechanicl test is recommended. Since the present invention produces encapsulated solder joints, environmental and mechanical tests are not expected to produce any significant changes in the resistivity of the bond.

There has thus been presented a solder paste incorporating a polymeric based flux composition that combines the environmental and processing advantages of ICAs with the joint-forming advantages of solder based materials. The invention has been described with respect to specific examples. However, various modifications of the present invention will be apparent to those skilled in the art from the above descriptions, and the present invention is intended to be limited solely by the scope of the following claims.

What is claimed is:

1. A polymer-based composition comprising:
   a polymerizable flux composition including a polyfunctional epoxy, a difunctional epoxy, a cycloaliphatic epoxy, a dicarboxylic acid, and a curing agent; and dispersed metal particles which melt at a temperature not exceeding 200° C. for fusing at such a temperature to form electrically-conductive continuous metal encapsulated within cured polymerized composition.

2. The composition of claim 1 including polyalcohol.

3. The composition of claim 2, wherein the polyalcohol is selected from the group consisting of ethylene glycol, propane diol, polyoxypropylene triols, and polyether triols.

4. The composition of claim 2, wherein the polyalcohol is selected from the group consisting of triethylene glycol, diethylene glycol, 1,3 propane diol and 1,2 propane diol.

5. The composition of claim 1, wherein the curing agent is an amine.

6. The composition of claim 5, wherein the amine is selected from the group consisting of primary, secondary and tertiary amines.

7. The composition of claim 1, wherein the curing agent is selected from the group consisting of the amidoamines.

8. The composition of claim 7, wherein the amidoamine is selected from the group consisting of alkyl amidoamine, dicyandiamide, and a composition including tetraethelyene pentamine.

9. The composition of claim 1, wherein the dicarboxylic acid is selected from the group consisting of glutaric acid, adipic acid, azelaic acid, and 1,3-cyclohexanedicarboxylic acid.

10. The composition of claim 1, further comprising a chelating agent, a defoamer, a thixotrope, and a surfactant.

11. The composition of claim 10, wherein the chelating agent is selected from the group consisting of ethylenediamine tetraaceticacid; 1,2-bis(3,5-di-tert-butyl-4-hydroxhydrocinnamoyl)hydrazine; and 2,2'-oxamido bis-[ethyl 3-(3,5-di-tert-butyl-4-hydroxyphenyl)propionate.]

12. The composition of claim 10, wherein the defoamer is a polymethacrylate defoamer.

13. The composition of claim 10, wherein the thixotrope is a polyamide wax.

14. The composition of claim 10, wherein the surfactant includes a mixture of polyalkyleneoxide modified heptamethyltrisiloxane and allyloxypolyethyleneglycol methyl ether.

15. A polymerizable composition comprising:
an epoxy-based flux formulation including, by weight, between 55%–65% of an epoxide composition; between 0% and 15% of a dicarboxylic acid; between 9% and 11% of a polyfunctional alcohol; between 3% and 5% of a curing agent; and
dispersed metal particles which melt at a temperature not exceeding 200° C. for fusing at such a temperature to form electrically-conductive continuous metal encapsulated within cured polymerized composition, wherein the metal particles form between 80% and 95% by weight of the polymerizable composition.

16. The composition of claim 15, wherein the epoxide composition is selected from the group consisting of epoxy novolacs; diglycidyl ethers of bisphenol A; diglycidyl ethers of bisphenol F, diglycidyl ester of hexahydropthalic (1,2-Cyclohexanedicarboxylic)anhydride; 3,4-epoxycyclohexylmethyl-3,4-epoxycyclohexane carboxylate; epoxy-acrylates; and mixtures thereof.

17. The composition of claim 15, wherein the dicarboxylic acid is selected from the group consisting of glutaric acid, adipic acid, azelaic acid, and 1,3-cyclohexanedicarboxylic acid.

18. The composition of claim 15, wherein the curing agent is a amidoamine thermal curing agent.

19. The composition of claim 15, wherein the polyalcohol is selected from the group consisting of ethylene glycol, propane diol, polyoxypropylene triols, and polyether triols.

20. The composition of claim 1 wherein the metal particles which melt at a temperature not exceeding 200° C. are selected from the group consisting of indium-tin eutectic (InSn) and lead-tin eutectic (PbSn).

21. The composition of claim 15 wherein the metal particles which melt at a temperature not exceeding 200° C. are selected from the group consisting of indium-tin eutectic (InSn) and lead-tin eutectic (PbSn).

22. A process of forming an encapsulated metallurgical joint from a polymerizable flux composition including dicarboxylic acid flux and particles dispersed therein of a metal which melts at a temperature not exceeding 200° C., the process comprising the steps of:

placing the polymerizable composition on the surface of a substrate;

heating the composition to a temperature not exceeding 200° C. for a time interval sufficient to melt the metal particles and remove surface oxide layer therefrom by the fluxing actin of the dicarboxylic acid to form continuous fused molten metal;

heating the composition to a temperature not exceeding 200° C. for an additional time interval to segregate the polymerizable flux composition from the fused metal, and to cure the polymerizable flux composition for creating a continuous polymerized thermoset surface layer encapsulating the fused molten metal; and cooling the composition to allow the fused molten metal to solidify as continuous metal encapsulated within the cured polymerized flux composition.

23. A composition according to claim 1 wherein the polyfunctional epoxy is an epoxy novolac.

24. A composition according to claim 1 wherein the polyfunctional epoxy novolac has a functionality of at least 3.0.

25. A composition according to claim 1 wherein the difunctional epoxy is a diglycidyl ether of bisphenol A.

26. A composition according to claim 1 wherein the difunctional epoxy is a diglycidyl ether of bisphenol F.

27. A composition according to claim 1 wherein the cycloaliphatic epoxy is diglycidyl ester of hexahydrophthalic anhydride.

28. A composition according to claim 1 wherein the cycloaliphatic epoxy is 3,4-epoxy-cyclohexylmethyl-3,4-epoxycyclohexane carboxylate.

29. A composition according to claim 1 wherein the total epoxy comprises at least 55% by weight of the polymerizable flux composition.

30. A composition according to claim 1 wherein the total dicarboxylic acid comprises 10% to 20% by weight of the polymerizable flux composition.

31. A composition according to claim 1 wherein the total amount of curing agent is 1% to 5% by weight of the polymerizable flux composition.

32. A composition according to claim 2 wherein the polyalcohol comprises 0% to 15% by weight of the polymerizable flux composition.

33. A composition according to claim 1 including epoxy diluent comprising 0% to 10% by weight of the polymerizable flux composition.

34. A composition according to claim 33 wherein the epoxy diluent is diglycidyl ether of neopentyl glycol.

35. A composition according to claim 10 wherein the chelating agent comprises 0% to 6% by weight of the polymerizable flux composition.

36. A composition according to claim 10 wherein the surfactant comprises 0.5% to 1.5% by weight of the polymerizable flux composition.

37. A composition according to claim 10 wherein the defoamer comprises 0.5% to 1% by weight of the polymerizable flux composition.

38. A composition according to claim 10 wherein the thixotrope comprises 0% to 6% by weight of the polymerizable flux composition.

39. A process according to claim 22 in which fluxing ingredients become part of polymerized composition.

* * * * *